(12) United States Patent
Wu

(10) Patent No.: US 7,795,704 B2
(45) Date of Patent: Sep. 14, 2010

(54) DIE SEAL RING AND WAFER HAVING THE SAME

(75) Inventor: Ping-Chang Wu, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 200 days.

(21) Appl. No.: 11/771,122

(22) Filed: Jun. 29, 2007

(65) Prior Publication Data

US 2009/0001522 A1    Jan. 1, 2009

(51) Int. Cl.
*H01L 23/544* (2006.01)

(52) U.S. Cl. .............................. 257/620; 257/E29.012; 438/113

(58) Field of Classification Search ................. 257/620, 257/E29.012; 438/113
See application file for complete search history.

(56) References Cited

U.S. PATENT DOCUMENTS

| 5,831,330 | A  | * | 11/1998 | Chang ........................ 257/620 |
| 6,876,062 | B2 |   | 4/2005  | Lee et al. |
| 2005/0179213 | A1 | * | 8/2005 | Huang et al. ................. 277/620 |
| 2005/0263855 | A1 |   | 12/2005 | Fu et al. |
| 2006/0194124 | A1 | * | 8/2006 | Watanabe et al. .............. 430/5 |

\* cited by examiner

*Primary Examiner*—Thao X Le
*Assistant Examiner*—Matthew Gordon
(74) *Attorney, Agent, or Firm*—WPAT, PC; Justin King

(57) ABSTRACT

A die seal ring disposed in a die and surrounding an integrated circuit region of the die is described. The die seal ring has at least two different local widths.

10 Claims, 3 Drawing Sheets

DIE SEAL RING AND WAFER HAVING THE SAME

BACKGROUND OF THE INVENTION

1. Field of the Invention

This invention relates to a wafer structure, and more particularly relates to a die seal ring that can effectively prevent a die from being damaged by the stress caused by sawing of the die and to a wafer wherein each die has such a die seal ring.

2. Description of Related Art

Along with the development in technology, integrated circuit devices have been widely applied in our daily life. Manufacture of an IC device generally includes three stages, production of a semiconductor wafer, fabrication of integrated circuits on the dies on the wafer and packaging of the dies cut from the wafer. The first step in the packaging stage is to cut the dies from the wafer.

A semiconductor wafer has a plurality of perpendicularly crossing scribe lines to separate a plurality of dies. After integrated circuits are formed on the dies, a diamond blade can be used to saw the wafer along the scribe lines to obtain single dies. Since various material layers are formed on the wafer, the stress caused by blade sawing easily causes damages like chipping and peeling to the dies, especially when there is a low-k material formed on the dies. Thus, the device reliability is lowered.

Another way to cut the dies is laser grooving, which still has certain problems however. For example, when a metal material has been formed on the wafer, the metal is difficult to remove completely by laser and forms debris that contaminates the dies. Moreover, a heat effect area is formed beside the scribe lines lowering the reliability of the dies. In addition, the price of a laser cutting system is 2-3 time higher than that of a diamond blade cutting system, so that the manufacturing cost is much increased.

Some methods capable of preventing damages like chipping and peeling of the die in the sawing have been provided. For example, as shown in FIG. 1, U.S. Pat. No. 6,876,062 teaches a structure 100 formed at a die corner and including an irregular seal ring 102 and a dummy pattern 103 to prevent the die from being damaged by the stress, wherein the dummy pattern 103 may be formed at both sides of the seal ring 102.

Though the above structure 100 effectively prevents the die from being damaged by the stress caused by sawing, the fabricating process adversely gets more complicated.

SUMMARY OF THE INVENTION

Accordingly, this invention provides a die seal ring that can effectively prevent a die from being damaged by the stress caused by sawing of the die.

This invention also provides a wafer that allows the dies sawn therefrom to have higher reliability.

The die seal ring of this invention is disposed in a die and surrounds an integrated circuit region of the die, having at least two different local widths.

In certain embodiments, the die is subjected to different stresses at different portions thereof as being sawn from a wafer, wherein the local width of the die seal ring at a portion of the die substantially increase with an increase in the stress thereat. In an embodiment, the different stresses include a first stress and a second stress higher than the first stress, the at least two different local widths include a first width and a second width larger than the first width, the first width is at a portion of the die subjected to the first stress, and the second width is at a portion of the die subjected to the second stress.

In another embodiment, the different stresses include, from low to high, a first stress, a second stress and a third stress, the at least two different local widths include, from small to large, a first width, a second width and a third width, the first width is at a portion of the die subjected to the first stress, the second width at a portion of the die subjected to the second stress and the third width at a portion of the die subjected to the third stress.

The wafer of this invention includes a plurality of dies separated by a plurality of scribe lines, wherein each die includes an integrated circuit region and a die seal ring surrounding the integrated circuit region, and the die seal ring has at least two different local widths.

In an embodiment, each die is subjected to different stresses at different portions thereof as being sawn from the wafer, and the local width of the die seal ring at a portion of the die substantially increase with an increase in the stress thereat. The die seal ring may include a metal.

In embodiments where the local width of the die seal ring at a portion of the die substantially increase with an increase in the stress thereat, a larger local width of the die seal ring can effectively prevent the die from being damaged by a higher stress thereat. Therefore, the die sawn from the wafer can have higher reliability.

In order to make the aforementioned and other objects, features and advantages of the present invention comprehensible, a preferred embodiment accompanied with figures is described in detail below.

DESCRIPTION OF EMBODIMENTS

It is noted that the following embodiments are intended to further explain this invention but not to limit the scope of this invention.

Figure 1:
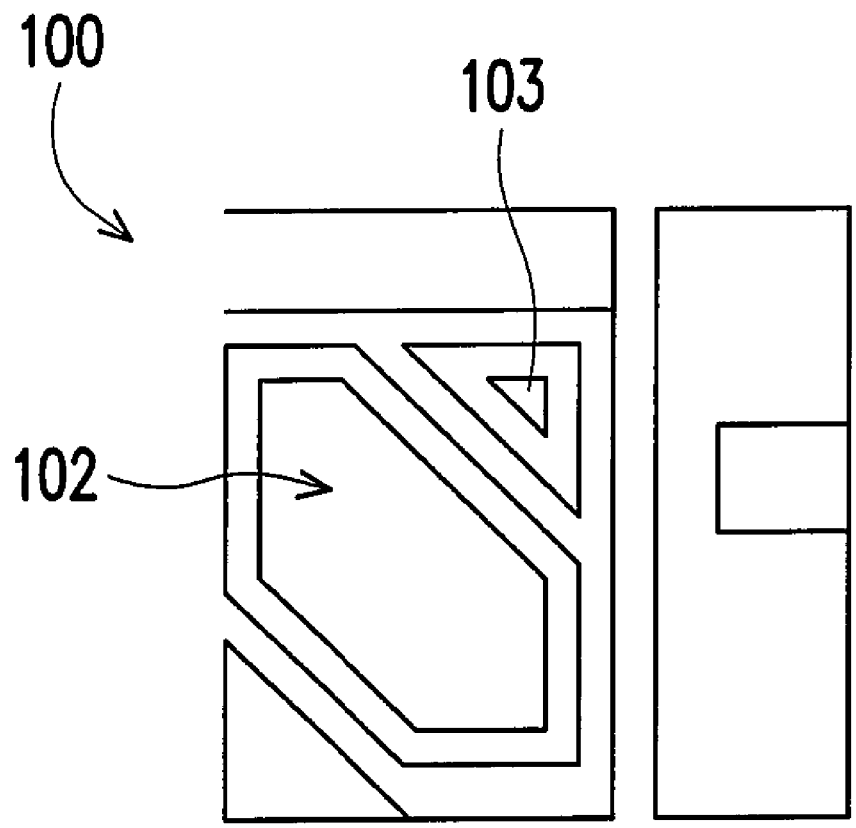
FIG. 1 illustrates a top view of a structure for preventing damages to a die in the prior art.
Figure 2:
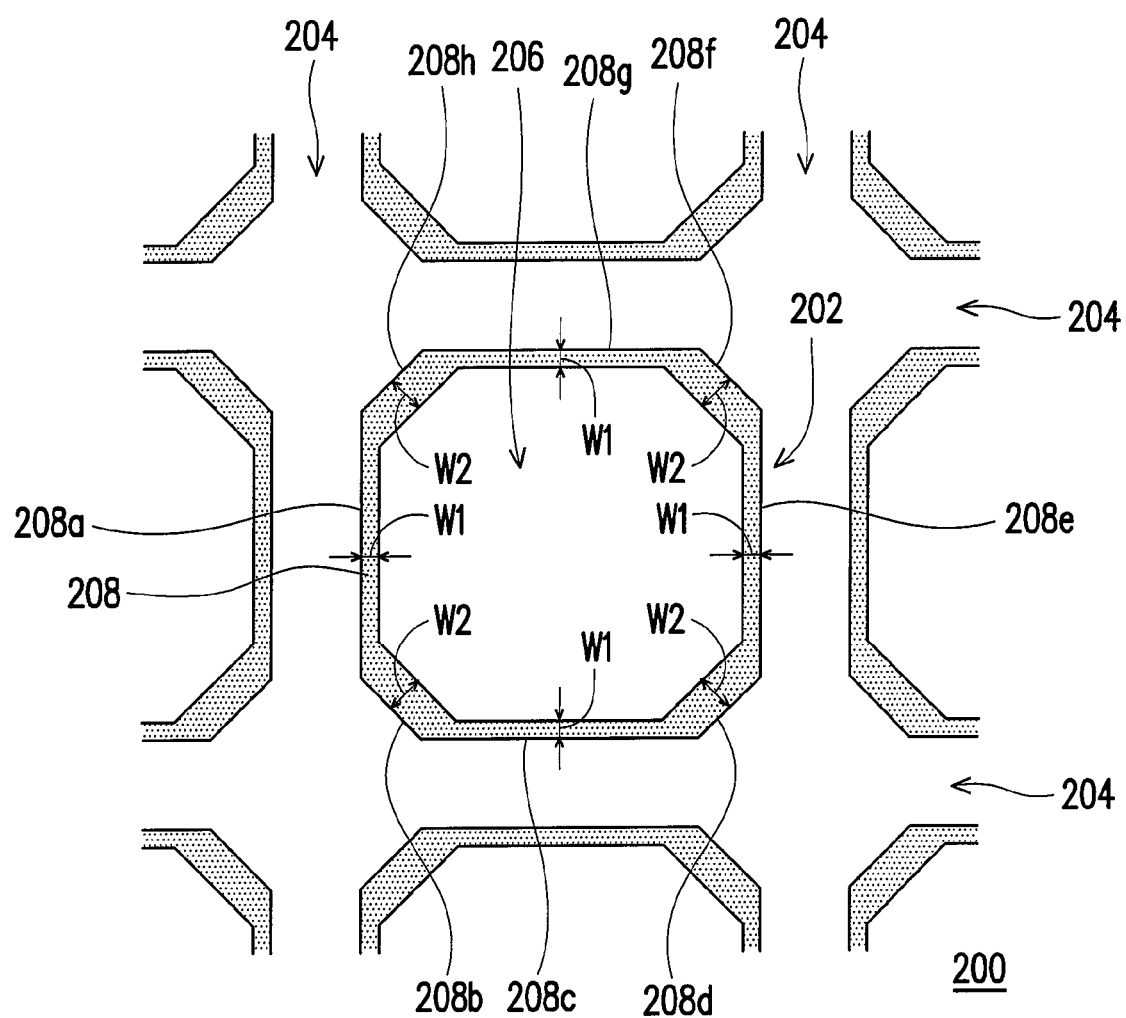
FIG. 2 illustrates a local top view of a wafer with die seal rings according to an embodiment of this invention.

FIG. 2 illustrates a local top view of a wafer with die seal rings according to an embodiment of this invention. The wafer 200 includes a plurality of dies 202 that are separated by a plurality of scribe lines 204, wherein each die 202 includes an integrated circuit (IC) region 206 and a die seal ring 208 surrounding the IC region 206. The material of the die seal ring 208 may be a metal like copper.

In this embodiment, the die seal ring 208 has an octangular shape and includes long segments 208a, 208c, 208e and 208g and short segments 208b, 208d, 208f and 208h. The long segments 208a to 208g have substantially the same width W1. The short segments 208b to 208h have substantially the same width W2 (>W1).

The local widths W1 and W2 of the die seal ring 208 are designed according to the stress distribution in the die 202 as being sawn from the wafer 200. When the die 202 is being sawn from the wafer 200, the stress S2 at a portion of the die 202 around a short segment 208b, 208d, 208f or 208h is higher than the stress S1 at a portion of the die 202 around a long segment 208a, 208c, 208e or 208g. The width W2 of the short segments 208b, 208d, 208f and 208h is larger than that (W1) of the long segments 208a, 208c, 208e and 208g to sustain the higher stress, so that the die 202 can be effectively prevented from being damaged by the stresses S1 and S2. Therefore, all the dies 202 sawn from the wafer 200 can have higher reliability.

Figure 3:
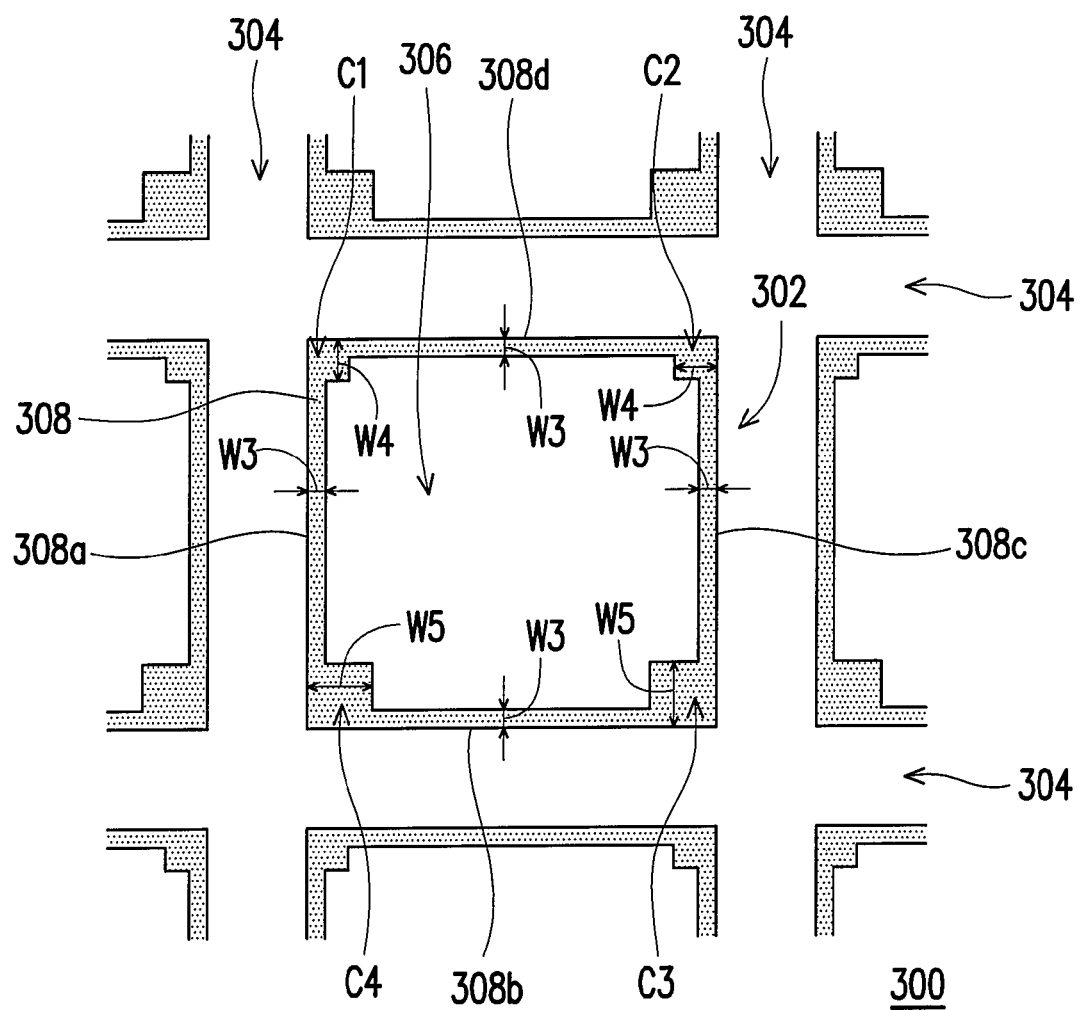
FIG. 3 illustrates a local top view of a wafer with die seal rings according to another embodiment of this invention.

FIG. 3 illustrates a local top view of a wafer with die seal rings according to another embodiment of this invention. The wafer 300 includes a plurality of dies 302 that are separated by a plurality of scribe lines 304, wherein each die 302 includes an IC region 306 and a die seal ring 308 surrounding the IC region 306. The material of the die seal ring 308 may also be a metal like copper.

In this embodiment, the die seal ring 308 has a quadrangular shape and includes four edge segments 308a, 308b, 308c and 308d and four corner segments C1, C2, C3 and C4. The edge segments 308a, 308b, 308c and 308d have substantially the same width W3. The corner segments C1 and C2 have substantially the same width W4 (>W3). The corner segments C3 and C4 have substantially the same width W5 (>W4).

The local widths W3, W4 and W5 of the die seal ring 308 are designed according to the stress distribution in the die 302 as being sawn from the wafer 300. When the die 302 is being sawn from the wafer 300, the stress S4 at a portion of the die 302 around the corner segment C1 or C2 is higher than the stress S3 at a portion of the die 302 around an edge segment 308a, 308b, 308c or 308d, the stress S5 at a portion of the die 302 around the corner segment C3 is higher than the stress S4, and the stress S6 at a portion of the die 302 around the corner segment C4 is higher than the stress S5. The width W4 of the corner segments C1 and C2 is larger than that (W3) of the edge segments 308a, 308b, 308c and 308d to sustain higher stress, and the width W5 of the corner segments C3 and C4 is larger than that (W4) of the corner segments C1 and C2 to sustain even higher stress. It is noted that though the stress S6 at a portion of the die 302 around the corner segment C4 is larger than the stress S5 at a portion of the die 302 around the corner segment C3, setting the same width (W5) to the corner segment C3 and C4 is feasible when the width W5 is sufficient for the corner segment C4 to sustain the higher stress S6.

It is noted that though an octangular or quadrangular die seal ring is exemplified in the above embodiments, one of ordinary skill in the art can understand, based on the above teaching, that increasing the local width of the die seal ring at a portion of the die subjected to a higher stress can prevent damages to the die more effectively. Therefore, the shape of the die seal ring in this invention are not limited to the above mentioned, but can be any other shape suitably to be formed in a die surrounding the IC region.

In each of the above embodiments, since the local width of the die seal ring at a portion of the die substantially increase with an increase in the stress thereat, a larger local width of the die seal ring can effectively prevent the die from being damaged by a higher stress thereat. Hence, the die sawn from the wafer can have higher reliability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A die seal ring, disposed in a die and surrounding an integrated circuit region of the die, and having at least three different local widths, each width being defined as a distance between an inner edge and an outer edge of the die seal ring wherein the die is subjected to different stresses at different portions thereof as being sawn from a wafer, the different stresses including, from low to high, a first stress, a second stress and a third stress, the at least three different local widths include, from small to large, a first width, a second width and a third width, wherein the first width is at a first portion of the die subjected to the first stress and is defined as a distance between substantially parallel opposite edges of the die seal ring at the first portion, the second width is at a second portion of the die subjected to the second stress and is defined as a distance between substantially parallel opposite edges of the die seal ring at the second portion, and the third width is at a third portion of the die subjected to the third stress and is defined as a distance between substantially parallel opposite edges of the die seal ring at the third portion, and at arbitrary portion of the die, the die seal ring has only one width that is defined as a distance between substantially parallel opposite edges of the die seal ring at the arbitrary portion of the die.

2. The die seal ring of claim 1, which comprises a metal.

3. A wafer that includes a plurality of dies separated by a plurality of scribe lines, wherein each die includes an integrated circuit region and a die seal ring surrounding the integrated circuit region, and is subjected to different stresses at different portions thereof as being sawn from the wafer, the different stresses including, from low to high, a first stress, a second stress and a third stress, the die seal ring has at least three different local widths, each width being defined as a distance between an inner edge and an outer edge of the die seal ring which include, from small to large, a first width, a second width and a third width, wherein the first width is at a first portion of the die subjected to the first stress and is defined as a distance between substantially parallel opposite edges of the die seal ring at the first portion, the second width is at a second portion of the die subjected to the second stress and is defined as a distance between substantially parallel opposite edges of the die seal ring at the second portion, and the third width is at a third portion of the die subjected to the third stress and is defined as a distance between substantially parallel opposite edges of the die seal ring at the third portion, and at arbitrary portion of the die, the die seal ring has only one width that is defined as a distance between substantially parallel opposite edges of the die seal ring at the arbitrary portion of the die.

4. The wafer of claim 3, wherein the die seal ring comprises a metal.

5. The die seal ring of claim 1, wherein the die includes four edge parts and four corner parts, the first portion of the die includes the four edge parts, and the second and third portions of the die include the four corner parts.

6. The die seal ring of claim 5, wherein the second portion of the die includes two of the four corner parts at a first side of the die, and the third portion of the die includes the other two of the four corner parts at a second side of the die opposite to the first side of the die.

7. The die seal ring of claim 5, wherein a segment of the die seal ring at each of the four corner parts of the die has a rectangular shape.

8. The wafer of claim 3, wherein the die includes four edge parts and four corner parts, the first portion of the die includes the four edge parts, and the second and third portions of the die include the four corner parts.

9. The wafer of claim 8, wherein the second portion of the die includes two of the four corner parts at a first side of the die, and the third portion of the die includes the other two of the four corner parts at a second side of the die opposite to the first side of the die.

10. The wafer of claim 8, wherein a segment of the die seal ring at each of the four corner parts of the die has a rectangular shape.

* * * * *